United States Patent [19]

Cheng

[11] Patent Number: 5,478,246
[45] Date of Patent: Dec. 26, 1995

[54] GUIDING AND PROTECTING HOUSING FOR MEMORY CARD CONNECTOR

[75] Inventor: Lee M. Cheng, Cupertino, Calif.

[73] Assignee: Hon Hai Precision Ind. Co., Ltd., Taipei Hsien, Taiwan

[21] Appl. No.: 259,898

[22] Filed: Jun. 15, 1994

[51] Int. Cl.⁶ .................................................. H01R 13/629
[52] U.S. Cl. .............................. 439/64; 361/753; 361/756
[58] Field of Search ............ 439/64, 377; 235/482–485; 361/753, 756

[56] References Cited

U.S. PATENT DOCUMENTS

| | | | |
|---|---|---|---|
| 4,236,667 | 12/1980 | Crowley et al. | 235/482 |
| 4,301,361 | 11/1981 | Lees | 235/483 |
| 4,441,018 | 4/1984 | Wessel | 235/482 |
| 5,308,251 | 5/1994 | Kaufman et al. | 439/64 |
| 5,357,402 | 10/1994 | Anhalt | 361/753 |
| 5,389,001 | 2/1995 | Broschard, III | 439/64 |

Primary Examiner—Neil Abrams

[57] ABSTRACT

A housing (10) incorporating a memory card connector (40) positioned in the computer for use with a memory card (100), is independently mounted on the backpanel (12) of the computer case and installed in the exterior of the computer case. The housing (10) is aligned with the inside corresponding memory card connector (40) by means of two opposite supporting arms (18) of the housing (10) being generally in alignment with the grooves (47) in the corresponding rails (44) of the memory card connector (40), respectively. The housing (10) further comprises a cavity (14) defined by walls of the housing (10) for receiving the rear portion of the inserted memory card (100) therein, and an opening (29), which is generally positioned about the centerline of the housing (10), recessed through the front portions of the top and bottom walls (15, 16) of the housing (10) for facilitating manually grasping the rear portion of the corresponding memory card (100) during insertion or withdrawal of such memory card (100) with regard to the computer case.

12 Claims, 6 Drawing Sheets

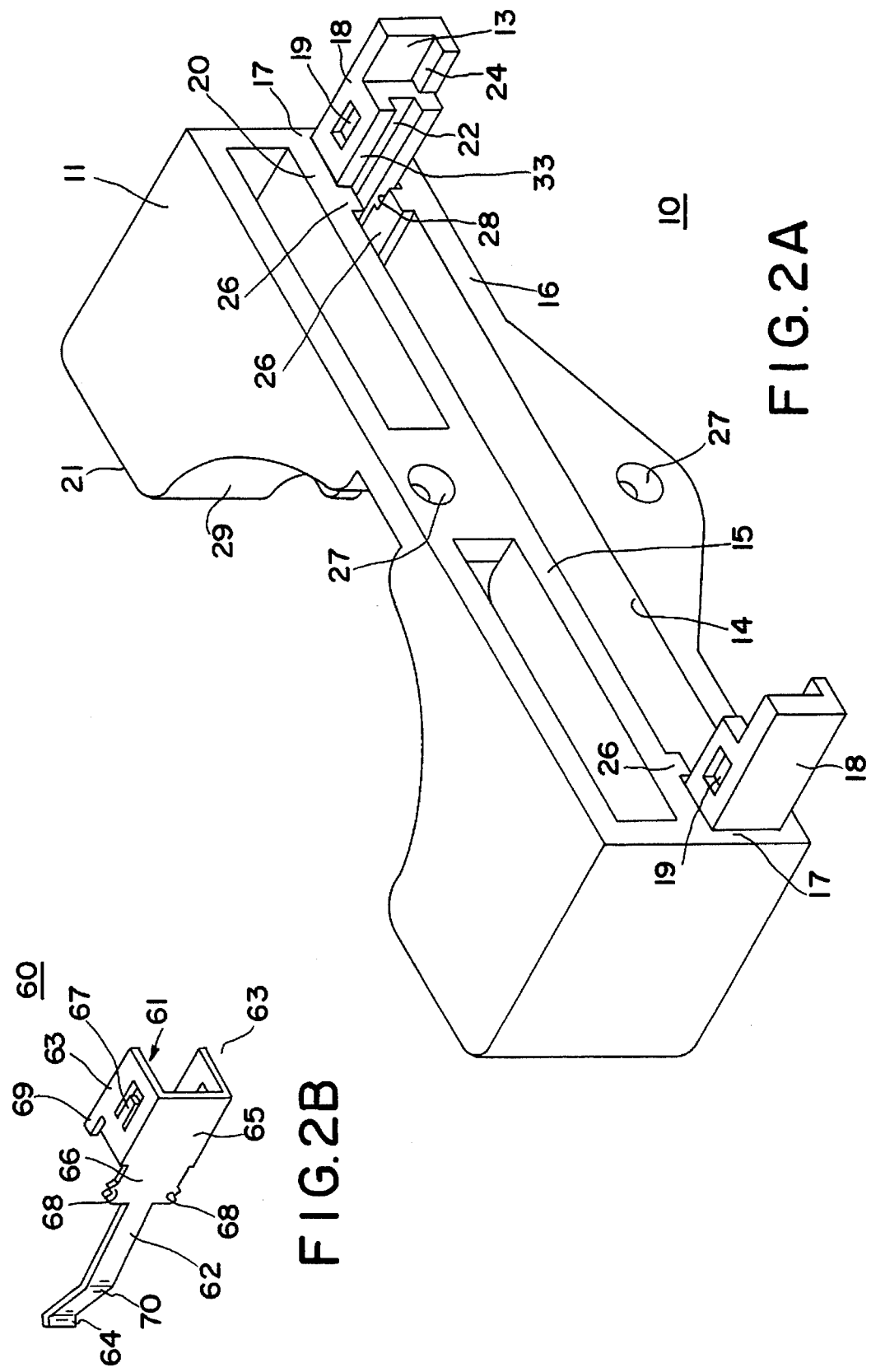

5,478,246

GUIDING AND PROTECTING HOUSING FOR MEMORY CARD CONNECTOR

BACKGROUND OF THE INVENTION

1. Field of The Invention

The invention relates to assemblies of memory card connectors, particularly to a guiding and protecting housing mounted on the backpanel of the computer case for incorporating the inside memory card connector.

2. The Prior Art

Memory cards were popularly used in the computer industry in the recent years. Generally, there are two ways to use such memory card with the computer set. The one is of a simple type which allows for directly manually inserting or withdrawing the memory card into or out of the inside corresponding memory card connector. The other one is of a lever-associated type which allows for withdrawing the inserted memory card by pressing down an ejector bottom beside. The former can be referred to U.S. Pat. Nos. 4,955, 817, 5,176,523, 5,234,351, 5,288,247, 5,290,174, 5,297,966, 5,308,251 and 5,315,478, and the latter can be referred to U.S. Pat. Nos. 4,810,200, 4,843,221, 4,592,161, 5,011,420, 5,026,296, 5,033,972, 5,051,101, 5,139,435, 5,145,389, 5,149,276, 5,152,697, 5,161,989, 5,197,894, 5,286,214, 5,299,946 and 5,304,070.

Frankly speaking, the latter might be more convenient than the former for the user when the memory card is intended to be withdrawn out of the memory card connector due to the additional ejection mechanism. However, such ejection lever sometimes is not reliable enough and becomes out-of-order after multiple repeated use, so that the inserted memory card may be stuck inside the corresponding connector. To prevent this situation, the ejection type memory card connector, which is installed inside the backpanel of the computer case, has a less length in the lengthwise direction of the insertion of the memory card with regard to the inserted memory card so that the rear portion of the memory card will protrude out of the backpanel of the computer case, as shown in FIG. 1, which allows directly manually grasping the rear portion of the memory card to withdraw the inserted memory card 100 out of the corresponding connector in the computer case under such out-of-order situation. It can be seen that most former type, i.e., no ejection mechanism type, memory card connectors also includes this feature for facilitating their operation. A disadvantage which may be found in this situation, is that such exposed rear portion of the inserted memory card may be incautiously hit by some unexpected matters, and thus the deflection of the card and/or the transferred forces often cause some damages of interconnection between the memory card and the corresponding memory card connector.

Therefore, an object of the invention is to provide an additional housing which can not only protect the protruding rear portion of the memory card from external hit, but also guide insertion of the memory card into the rail of the inside memory card connector.

SUMMARY OF THE INVENTION

According to an aspect of the invention, a housing incorporating a memory card connector positioned in the computer case for use with a memory card, is independently mounted on the backpanel of the computer case and installed in the exterior of the computer case. The housing is aligned with the inside corresponding memory card connector by means of two opposite supporting arms in the housing being generally in alignment with the grooves in the corresponding rails of the memory card connector, respectively. The housing further comprises a cavity defined by walls of the housing for receiving the rear portion of the inserted memory card therein, and an opening, which is generally positioned about the centerline of the housing, recessed through the front portions of the top and bottom walls of the housing for facilitating manually grasping the rear portion of the corresponding memory card during insertion or withdrawal of such memory card.

BRIEF DESCRIPTION OF THE DRAWINGS

FIG. 2(A) is an enlarged perspective view of the housing of FIG. 2.

FIG. 2(B) is an enlarged perspective view of the grounding clip of FIG. 2.

DETAILED DESCRIPTION OF THE PREFERRED EMBODIMENT

References will now be made in detail to the preferred embodiments of the invention. While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by appended claims.

Figure 1:
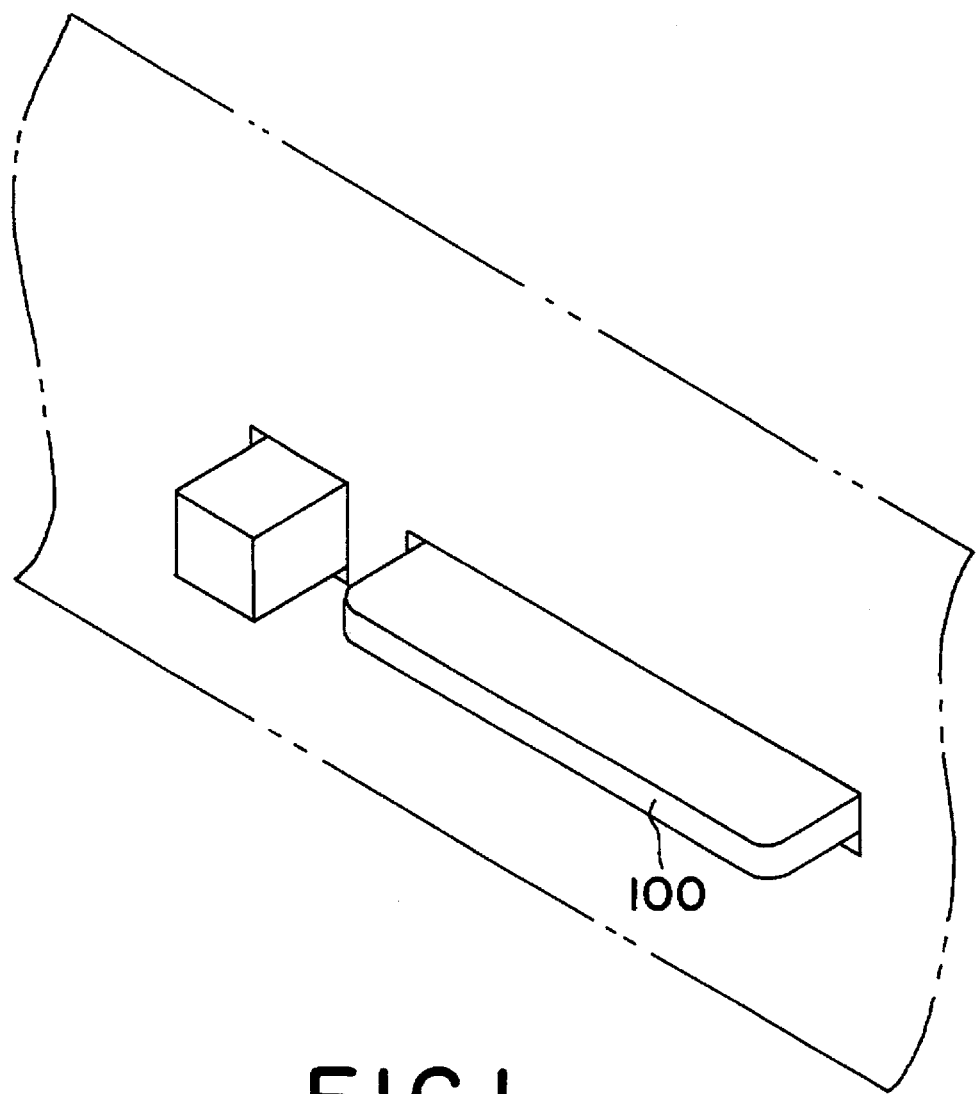
FIG. 1 is a partial back perspective view of a computer case of the prior art ejector-associated type memory card connector having memory card installed therein to show the relationship between the backpanel of the computer case and the inserted memory card.
Figure 2:
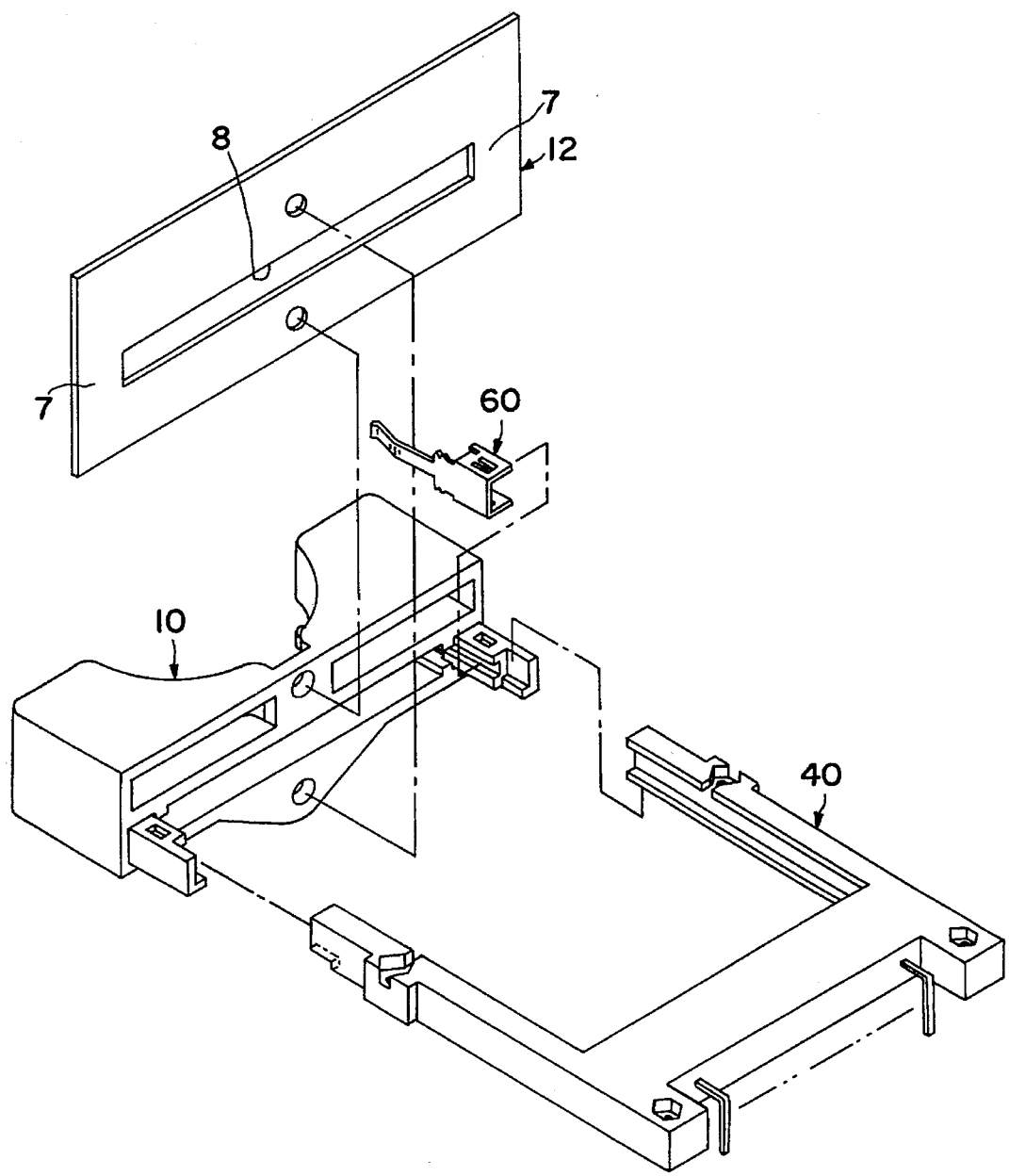
FIG. 2 is a perspective view of the housing mounted on the backpanel and incorporating the memory card connector in the present invention.

It will be noted here that for a better understanding, like components are designated by like reference numerals throughout the various figures in the embodiment. Attention is now directed to FIGS. 2 and 2(A) wherein a guiding and protecting housing 10 is intended to be mounted to the backpanel 12 of the computer case (not shown).

The housing 10 has generally a rectangular body 11 including a central cavity 14 for reception of the rear portion of an inserted memory card therein. Such cavity 14 is generally formed by a top wall 15, a bottom wall 16, two side walls 17. A pair of supporting arms 18 respectively integrally extend rearward out of a rear surface 20 of the body 11 of the housing 10 at two ends.

Each supporting arm 18 includes a groove 22 on its inner side extending in a front-to-back direction and such groove 22 extends into the body 11 in the same front-to-back direction but terminates before it reaches the front surface 21 of the body 11 of the housing 10. Beside such groove 22, also referring to FIGS. 3(A) and 3(B), a retention wall 23 extends from the front surface 21 of the body 11 of the housing 10, such that a pocket 25 of the body 11 is formed adjacent the front end of such groove 22 for receiving a front end 64 of a spring finger 62 of a ground clip 60. A side wall 13 extends rearward at the rear end of the supporting arm 18 and a step 24 extends therefrom for engagement with a complementary notch 42 on the underside of the end of the rail 44 of the corresponding memory card connector 40, referring to FIG. 2(C). A pair of indents 19 are respectively positioned in the top and bottom portions of each supporting arm 18 for retaining the grounding clip 60.

Adjacent to each supporting arm 18, a pair of engaging bars 26 integrally oppositely extend from the top wall 15 and the bottom wall 16, thereby defining a less height between than that in the other central portion of the cavity 14 and such less height is generally equal to the height of the groove 22 thereabout. A tiny short slit 28 intermediating between each engaging bar 26 and the corresponding supporting arm 18, extends inwardly from the rear surface 20 for receiving a retention section 66 of the grounding clip 60.

The body 11 of the housing 10 further includes an upper and a lower screw holes 27 positioned in the centerline thereof so that such housing 10 can be fastened to the backpanel 12 of the computer case by means of screws (not shown). It can be understood that in this embodiment the upper portion of the body 11 of the housing 10 does not perform the substantial function for protecting or guiding the inserted memory card, but may provide a reinforcement function for the whole structure of the housing 10 and beautify the appearance thereof.

A semi-circular opening 29 is positioned in the front portion of the body 11 of the housing 12 and extends therethrough in a vertical direction wherein the center of such opening 29 is substantially in the aforementioned centerline of body 11 of the housing 10.

Referring to FIGS. 2 and 2(B), the grounding clip 60 (only one shown in FIG. 2) which is fastened to the supporting arm 18, includes a generally U-shaped base 61 formed by a pair of opposite plates 63 and a bight 65 therebetween. A tang 67 which is sheared off from each plate 63, extends into the corresponding indent 19 in the supporting arm 18 so that such grounding clip 60 can be securely attached to the supporting arm 18 wherein the bight 65 abuts against the inner surface 33 of the supporting arm 18. An spring tab 69 outwardly and forwardly extends at the front edge of the plate 63 so that the front end of the spring tab 69 can substantially abut against the rear surface 20 of the body 11 of the housing 12, thus resulting in a grounding path therethrough to reach the backpanel 12 to which the rear surface 20 of the body 11 of the housing 10 is tightly attached.

Figure 3A:
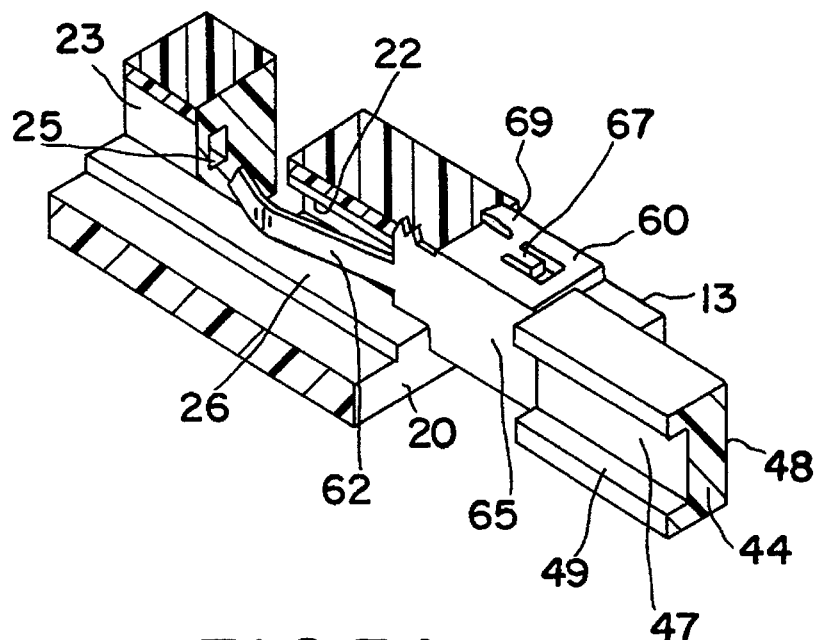
FIG. 3(A) is a cut-away perspective view of the right portion of the housing of FIG. 2 to show the structural relationship among the housing, the grounding clip and the memory card connector.
Figure 3B:
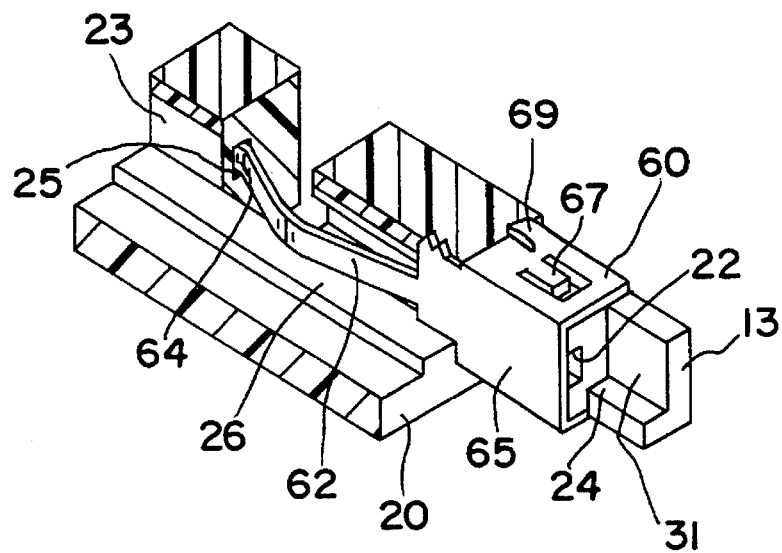
FIG. 3(B) is a cut-away perspective view of the right portion of the housing of FIG. 2 to show the structural relationship between the housing and the grounding clip.

The retention section 66 forwardly integrally extends from the bight 65 of the grounding clip 60, and barbs 68 are positioned on two sides thereof. Therefore, the retention section 66 is properly received within the slit 28 of in the body 11 of the housing 10 and the barbs 68 pierce into the body 11 when the grounding clip 60 is assembled to the housing 10 as shown in FIGS. 3(A) and 3(B). The front end 64 of the spring finger 62 can be embedded within the pocket 25 in the body 11 of the housing 10, and the whole finger 62 can be deflectably received within the groove 22 in the body 11 of the housing 10 when the memory card is inserted therein.

Figure 2C:
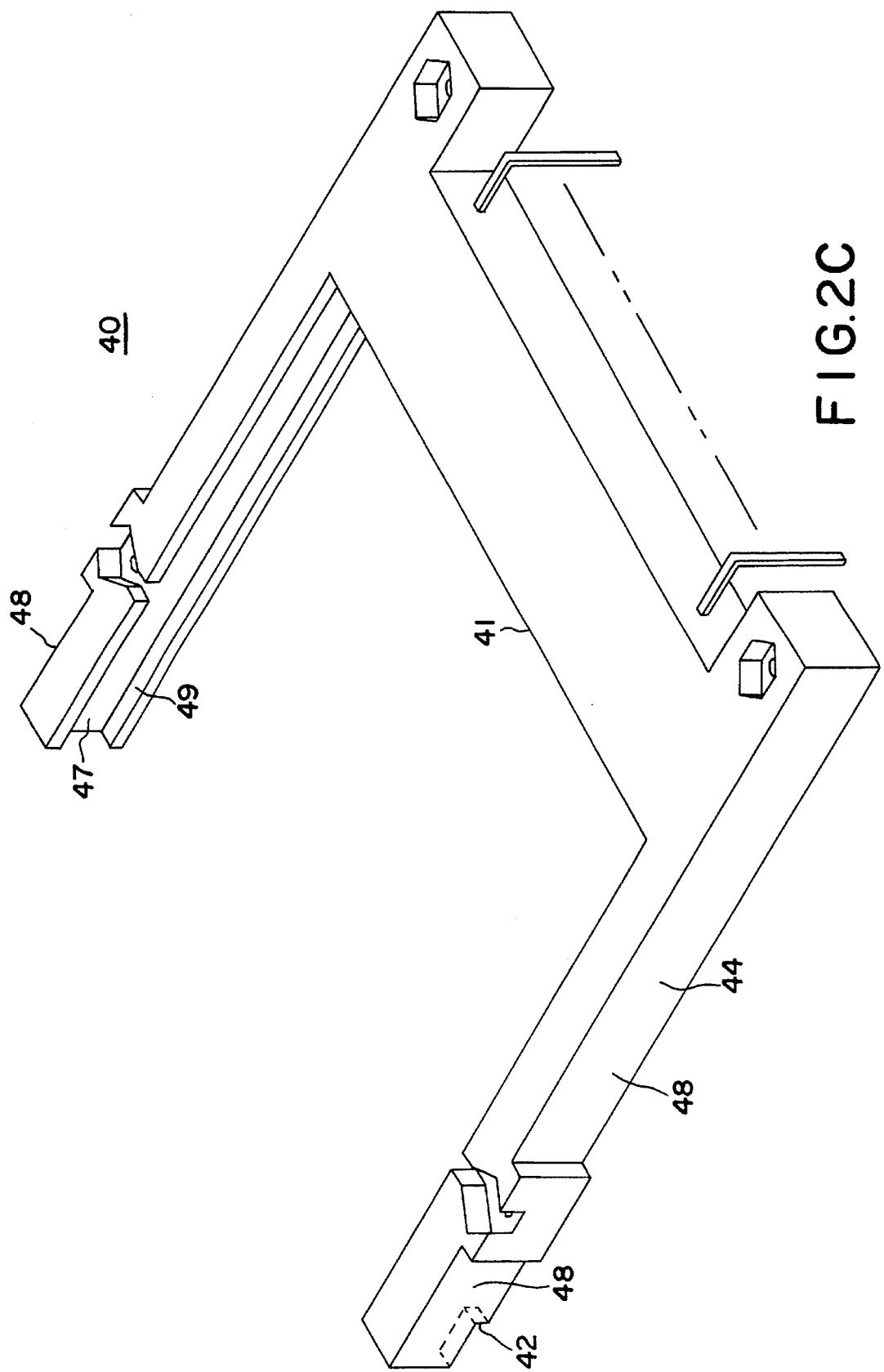
FIG. 2(C) is an enlarged perspective view of the memory card connector of FIG. 2.

The memory card connector 40 as shown in FIGS. 2, 2(C) and 3(A), is generally designedly mounted on a PC board through plural screws (not shown) extending through the corresponding screw holes 46 in the memory card connector 40 and in the PC board. The memory card connector 40 with the associated PC board can be assembled to the housing 10 in a top-loading manner. When assembled, the step 24 of the supporting arm 18 of the housing 10 can be substantially received within the notch 42 of the rail 44 of the connector 40, and outer surface 48 of the rail 44 of the connector 40 generally abuts against the inner surface 31 of the side wall 13 of the housing 10 so that the connector 40 can be properly confined between such two supporting arm 18. It can be also understood that the inner surface 47 of the channel 49 of the rail 44 is generally aligned with the bight 65 of the grounding clip 60 so that the two opposite sides of the inserted memory card may properly guidably slide within the channel 49 of such rail 44 during insertion or withdrawal procedure.

It can be seen that the backpanel has slot 8 dimensioned to be comply with the configuration of the cavity 14 and two opposite supporting arms 18 so that such housing 10 is attached to the backpanel 12 with two opposite supporting arms 18 respectively abutting against two side portions 7 of the backpanel 12, thus defining the lateral dimension of such slot 8. In fact, the whole structure related to the housing 10 and the corresponding memory card connector 40, further includes a chassis (not shown) which can be integrally formed with or detachably fastened to the backpanel 12. Such chassis comprises a pair of side bars, perpendicular to the backpanel 12, onto which two side portions of the PC board having the memory card connector thereon, is securely loaded from the top. Moreover, the edge of the PC board may be generally positioned adjacent to the backpanel 12 of the computer case. Under this condition, a pair of notches should be positioned at the edge of the PC board to allow the supporting arms 18 of the housing 10 to pass therethrough during top-loading of the PC board. In this embodiment, the engagement of the steps 24 of the supporting arms 18 of the housing 10 and the notches 42 of the rail 44 of the memory card connector 40 only provides functions of orientation and alignment between the memory card connector 40 and the housing 10, and these two components are not directly fastened together.

Figure 4:
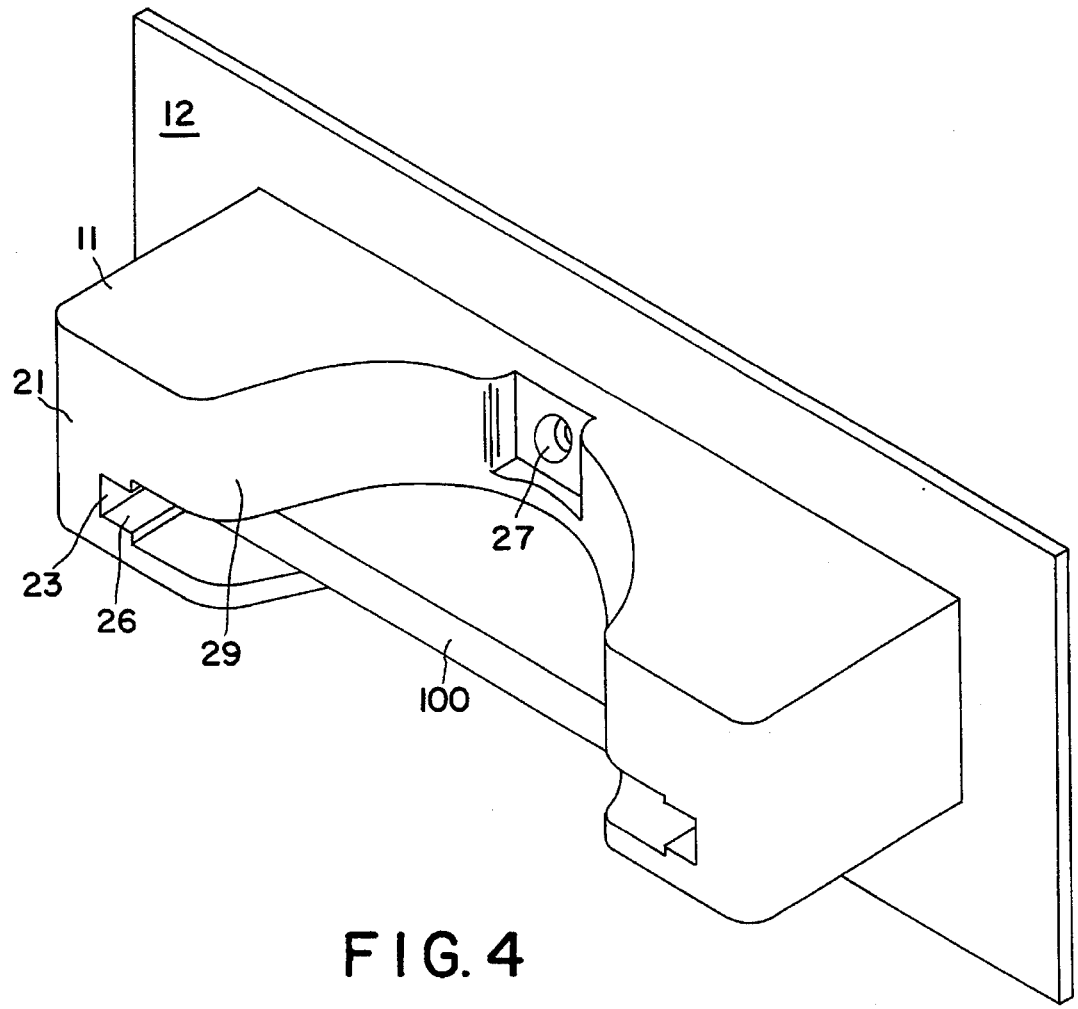
FIG. 4 is a back perspective view of the housing and the backpanel to show the inserted memory card is protected by the housing of FIG. 2.

When the memory card connector 40 and its associated PC board are assembled to the chassis in position, the channel 49 of the rail 44 of the memory card connector 40 is dimensioned to be generally equal to and substantially aligned with the space between the corresponding pair of engaging bars 26. Thus, referring to FIG. 4, the memory card 100 can be efficiently guidably inserted into the cavity 14 in the housing 10 from the outside. The side edge of the memory card 100 first substantially confronts the retention wall 23 of the pocket 25 and successively touches the angular section 70 of the grounding clip 60, thus pushing and deflecting such angular section 70 outwardly into the groove 22. By means of this contact, the electrostatics accumulated on the surface of the memory card can be removed therefrom, through the grounding path defined by spring finger 62, the retention section 66, the base 61 and the spring tab 69 of the grounding clip 60 to the backpanel 12 and the computer case.

The continuing forward movement of the memory card 100 allows the side edge of the memory card 100 successively slide along the retention section 66, the bight 65 of the grounding clip 60, and the inner surface 47 of the rail 44 of the memory card connector 40 until the front mating surface of the memory card 100 confronts the mating surface 41 of the memory card connector 40.

It should be understood that the height of the middle portion of the cavity 14 is substantially larger than the height of the side portions of the cavity 14. This feature is adopted to fit different type memory cards, of which some have an expansion middle portion in comparison with others.

It can be contemplated that in the present invention no ejector is involved, so the directly pushing and pulling the memory card assures a reliable connection between the memory card and the corresponding memory card connector. Additionally, the housing which covers the contour of the exposed rear portion of the inserted memory card provides the protection function for preventing the rear portion of the memory card, which protrudes out of the backpanel of the computer case, from any improper or incautious external collision. By means of elongated engaging bars, the spring finger and the bight of the grounding clip, the external housing also provides an effective entry guidance function for insertion of the memory card into the internal memory card connector, and that can prevent the memory card from being tilted or misaligned with regard to the corresponding memory card connector during insertion.

Moreover, different from most previous memory card connectors, of which the grounding clip is directly mounted on the rail and electrically coupled to the circuit traces on the PC board on which such memory card connector is seated, the grounding clip of this invention is fastened to the housing 10 and directly grounded to the chassis through the backpanel. In other words, the prior arts have their electrostatic grounding clip function as a system grounding which requires some specific grounding path and occupies space on the PC board and that may complicates the signal circuit design of such PC board, but the present invention adopts an additional housing on which such grounding clip can be located and directly electrically coupled to the chassis through the backpanel. Therefore, in the present invention the grounding path for electrostatics is shorter and more effective, and eliminates the space of the grounding circuits on the PC board so as to allow for more efficiently configuring circuits on such PC board design.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. A guiding and protecting housing for use with a memory card connector in a computer set, said housing outwardly mounting on a backpanel of said computer, said comprising:

an elongated body including a central cavity for reception of a rear portion of a memory card adapted to be received in said memory card connector;

a pair of supporting arms respectively extending outwardly from a rear surface of the body and rearward through the backpanel for engagement with the corresponding memory card connector; and a pair of grounding clips positioned on the supporting arms, respectively.

2. The housing as described in claim 1, wherein a pair of steps are formed on said pair of supporting arms for engagement with a pair of notches on bottom sides of a pair of rails of the memory card connector, respectively, such that the memory card connector and its associated PC board on which said memory card connector is mounted, can be assembled to said housing with a toploading, and the rails of said memory card connector is aligned with said supporting arms of the housing for guiding insertion of said memory card into said memory card connector.

3. The housing as described in claim 2, wherein each supporting arm of the housing further comprises a side wall on an outermost portion for restraining the lateral movement of the corresponding engaged rail of the memory card connector.

4. The housing as described in claim 1, wherein said grounding clip comprises a base for fastening to said corresponding supporting arm, a spring finger extending forwardly for confrontation with the inserted memory card and removing electrostatics of said memory card therefrom, and a spring tab extending from said base for mechanically and electrically engagement with the backpanel of the computer set to form a grounding path.

5. The housing as described in claim 4, wherein each supporting arm includes indents incorporating tangs projecting from the base of the grounding clip for retaining the grounding clip on the supporting arm, and a groove extending into the body for receiving the corresponding spring finger of the grounding clip therein when said spring finger is deflected by the inserted memory card.

6. The housing as described in claim 1, wherein adjacent to each supporting arm, a pair of engaging bars integrally extending from a top wall and a bottom wall of the body of the housing, thereby defining a height which is generally equal to a thickness of the inserted memory card.

7. The housing as described in claim 6, wherein a slit is positioned between each engaging bar and the corresponding supporting arm for receiving a retention section of said grounding clip therein.

8. The housing as described in claim 1, wherein a semicircular opening is positioned in a front portion of said body so that the rear portion of the memory card in the cavity can be accessibly grasped manually from an exterior.

9. A structure for use with a memory card in a computer set, comprising:

an external housing fastening to a backpanel of the computer set, said housing including an elongated body, a rear surface of which abuts against said backpanel;

a cavity formed in said body for receiving the memory card therein;

a pair of supporting arms rearward extending from said rear surface of the body into an interior of the computer set;

an internal memory card connector mounted on a PC board in said computer set wherein a pair of rails of said memory card connector are respectively aligned with said pair of supporting arms of the housing for easy and precisely guiding insertion of the memory card therein.

10. The structure as described in claim 9, wherein said housing further comprises a pair of grounding clips respectively positioned on said pair of supporting arms, a spring finger of said grounding clip projecting into the cavity of the housing and adapted to deflectably confront the inserted memory card.

11. The structure as described in claim 9, wherein each supporting arm further includes a side wall and a step for supportably and restrainably aligning the corresponding rail of the memory card connector therewith so that the inserted memory card can be precisely mated within said memory card connector.

12. A mechanism in a computer set for guiding and protecting a card-like member inserted within said computer set, comprising:

a backpanel positioned on a rear side of said computer set, said backpanel including an elongated slot therein;

an external housing positioned on said backpanel, said housing including an elongated body having a cavity for reception of said card-like member therein, a pair of supporting arms integrally extending rearward from said body and through said slot of the backpanel wherein said cavity of the housing is generally aligned with said slot; and a pair of internal rails positioned inside the backpanel and generally supportably aligned with said pair of supporting arms, respectively, for receiving the inserted card-like member therein and coupling said card-like member to an internal connector.

* * * * *